(12) United States Patent
Xie et al.

(10) Patent No.: US 10,236,363 B2
(45) Date of Patent: Mar. 19, 2019

(54) VERTICAL FIELD-EFFECT TRANSISTORS WITH CONTROLLED DIMENSIONS

(71) Applicant: GLOBALFOUNDRIES Inc., Grand Cayman (KY)

(72) Inventors: Ruilong Xie, Schenectady, NY (US); Chun-chen Yeh, Danbury, CT (US); Kangguo Cheng, Schenectady, NY (US); Tenko Yamashita, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 269 days.

(21) Appl. No.: 15/458,457

(22) Filed: Mar. 14, 2017

(65) Prior Publication Data

US 2018/0269312 A1 Sep. 20, 2018

(51) Int. Cl.
*H01L 29/66* (2006.01)
*H01L 21/311* (2006.01)
*H01L 21/324* (2006.01)
*H01L 29/417* (2006.01)
*H01L 29/78* (2006.01)
*H01L 29/10* (2006.01)

(52) U.S. Cl.
CPC ...... *H01L 29/66795* (2013.01); *H01L 21/324* (2013.01); *H01L 29/1037* (2013.01); *H01L 29/41791* (2013.01); *H01L 29/66553* (2013.01); *H01L 29/785* (2013.01); *H01L 2029/7858* (2013.01)

(58) Field of Classification Search
CPC ............... H01L 29/7827; H01L 27/088; H01L 45/1233; H01L 21/823821; H01L 29/78618; H01L 29/0676; H01L 29/785; H01L 21/823487; H01L 27/0924; H01L 29/66795; H01L 21/823885; H01L 21/845; H01L 27/0886; H01L 29/6795; H01L 29/1037; H01L 21/31111; H01L 21/324; H01L 2029/7858
See application file for complete search history.

(56) References Cited

U.S. PATENT DOCUMENTS

| | | | |
|---|---|---|---|
| 5,087,581 A | * | 2/1992 | Rodder ............... H01L 29/1033 257/E21.41 |
| 9,312,383 B1 | * | 4/2016 | Cheng ................. H01L 29/7827 |
| 9,368,572 B1 | * | 6/2016 | Cheng ................. H01L 29/7827 |

(Continued)

*Primary Examiner* — Caridad Everhart
(74) *Attorney, Agent, or Firm* — Thompson Hine LLP; Anthony Canale

(57) ABSTRACT

Device structures and fabrication methods for a vertical field-effect transistor. A semiconductor fin is formed that projects from a first source/drain region. A first spacer layer is formed on the first source/drain region. A dielectric layer is formed that extends in the vertical direction from the first spacer layer to a top surface of the semiconductor fin. The dielectric layer is recessed in the vertical direction, and a second spacer layer is formed on the recessed dielectric layer such that the dielectric layer is located in the vertical direction between the first spacer layer and the second spacer layer. After the dielectric layer is removed to open a space between the first spacer layer and the second spacer layer, a gate electrode is formed in the space. The vertical field-effect transistor has a gate length that is equal to a thickness of the recessed dielectric layer.

20 Claims, 3 Drawing Sheets

(56) References Cited

U.S. PATENT DOCUMENTS

| | | | |
|---|---|---|---|
| 9,653,288 B1* | 5/2017 | Holland | H01L 29/0676 |
| 2005/0067630 A1* | 3/2005 | Zhao | H01L 29/8083 |
| | | | 257/134 |
| 2007/0090363 A1* | 4/2007 | Abbott | H01L 27/10823 |
| | | | 257/68 |

* cited by examiner

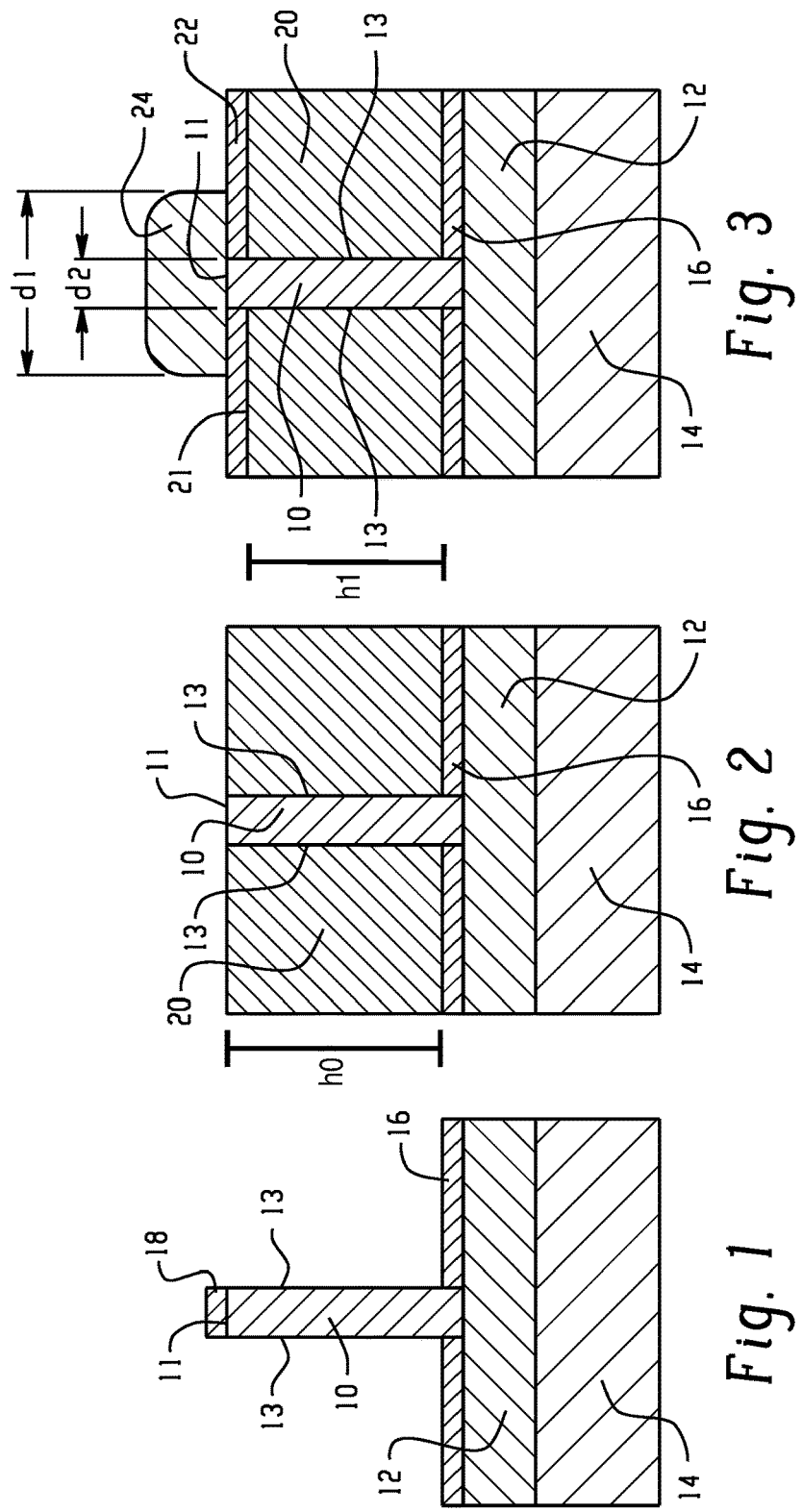

VERTICAL FIELD-EFFECT TRANSISTORS WITH CONTROLLED DIMENSIONS

BACKGROUND

The present invention relates to semiconductor device fabrication and integrated circuits and, more specifically, to device structures for a vertical field-effect transistor and methods of fabricating a vertical field-effect transistor.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate with which they are formed. In a vertical field-effect transistor, the channel is located in a semiconductor fin that projects in the vertical direction from the surface of the semiconductor substrate. The source and the drain are arranged at the top and bottom of the semiconductor fin. The direction of the gated current flow in the channel between the source and drain is generally perpendicular (i.e., vertical) to the substrate surface and parallel to the height of the fin.

The gate length of a vertical field-effect transistor is defined by depositing gate material between semiconductor fins and then recessing the gate material to a given height relative to the top surface of the semiconductor fins. The etch-back process used to recess the gate material can introduce variations in the gate length among the different vertical field-effect transistors due to variations in the etching process.

SUMMARY

According to an embodiment, a structure for a vertical field-effect transistor includes a first source/drain region, a second source/drain region, a semiconductor fin having a sidewall that extends in a vertical direction from the first source/drain region to the second source/drain region, and a gate electrode coupled with the sidewall of the semiconductor fin. The gate electrode is arranged in the vertical direction between the first source/drain region and the second source/drain region. The gate electrode and the second source/drain region have equal widths in a horizontal direction orthogonal to the vertical direction.

According to another embodiment, a method is provided for forming a vertical field-effect transistor. The method includes forming a first source/drain region, forming a semiconductor fin projecting in a vertical direction from the first source/drain region, forming a first spacer layer on the first source/drain region, and forming a dielectric layer surrounding a sidewall of the semiconductor fin and extending with a first thickness in the vertical direction from the first spacer layer to a top surface of the semiconductor fin. The dielectric layer is recessed in the vertical direction to provide a second thickness that is less than the first thickness. After the dielectric layer is recessed, a second spacer layer is formed on the dielectric layer such that the dielectric layer is located in the vertical direction between the first spacer layer and the second spacer layer. The dielectric layer is removed to form a space between the first spacer layer and the second spacer layer. After the dielectric layer is removed from the space, a gate electrode is formed in the space. The vertical field-effect transistor has a gate length that is equal to the second thickness of the dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-7 are cross-sectional views of a structure at successive fabrication stages of a processing method in accordance with embodiments of the invention.

DETAILED DESCRIPTION

Figure 5:
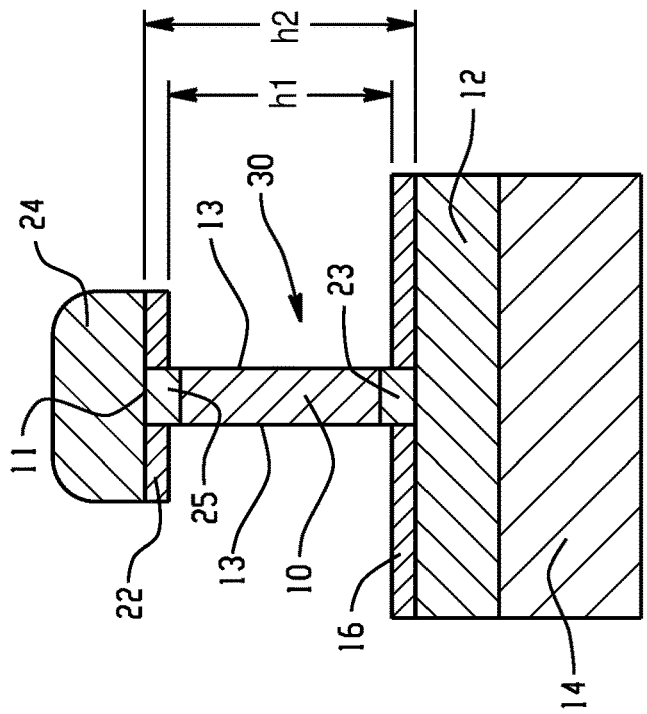

With reference to FIG. 1 and in accordance with an embodiment of the invention, a fin 10 may project in a vertical direction from a bottom source/drain region 12. The bottom source/drain region 12 may be a portion of a doped epitaxial layer at the top surface of a substrate 14. As used herein, the term "source/drain region" means a doped region of semiconductor material that can function as either a source or a drain of a vertical field-effect transistor. The substrate 14 beneath the bottom source/drain region 12 may be, for example, a bulk single-crystal silicon substrate. The fin 10 may be used to form a vertical field-effect transistor as described hereinbelow. Additional fins (not shown) may be located on the bottom source/drain region 12 adjacent to fin 10 and used to form the vertical field-effect transistor.

The fin 10 may be a three-dimensional body comprised of a semiconductor material, such as undoped or intrinsic silicon, and project in the vertical direction relative to the top surface of the substrate 14. The fin 10 has a top surface 11, and sidewalls 13 that extend in the vertical direction from top surface 11 to intersect with the bottom source/drain region 12. The fin 10 may be formed from an epitaxial layer of intrinsic semiconductor material, which is grown on the bottom source/drain region 12 and patterned using photolithography and etching processes, such as a sidewall imaging transfer (SIT) process or self-aligned double patterning (SADP). The bottom source/drain region 12 may function to provide an endpoint for the etching process used to form the fin 10.

In connection with an n-type vertical field effect transistor, the bottom source/drain region 12 may be composed of silicon and include a concentration of an n-type dopant from Group V of the Periodic Table (e.g., phosphorus (P) or arsenic (As)) that is effective to impart n-type electrical conductivity to the constituent semiconductor material. In connection with a p-type vertical field effect transistor, the bottom source/drain region 12 may be composed of a silicon-germanium (SiGe) alloy and include a concentration of p-type dopant from Group III of the Periodic Table (e.g., boron (B)) in a concentration that is effective to impart p-type to the constituent semiconductor material.

A bottom spacer layer 16 is formed on the bottom source/drain region 12. The bottom spacer layer 16 may be composed of a dielectric material, such as silicon nitride ($Si_3N_4$), that is deposited by a directional deposition technique, such as gas cluster ion beam (GCIB) deposition, and that is an electrical insulator. The fin 10 penetrates in the vertical direction through the thickness of the bottom spacer layer 16 with only a fraction of its length (i.e., height) overlapped by the bottom spacer layer 16. A cap 18 composed of the spacer material may be formed on a top surface 11 of the fin 10 in association with the formation of the bottom spacer layer 16. Because the deposition is directional, the dielectric material used to form the bottom spacer layer 16 does not deposit on the sidewalls 13 of the fin 10.

With reference to FIG. 2 in which like reference numerals refer to like features in FIG. 1 and at a subsequent fabrication stage, a gap-fill layer 20 is formed on the top surface of the bottom spacer layer 16. The gap-fill layer 20 may be composed of a dielectric material, such as silicon dioxide ($SiO_2$), deposited by chemical vapor deposition (CVD). The gap-fill layer 20 may be formed by depositing a layer of its constituent dielectric material that buries the fin 10, and planarizing the layer with, for example, chemical mechanical polishing (CMP) to be coplanar with a top surface 11 of the fin 10. After planarization, the gap-fill layer 20 has a given thickness, h0.

With reference to FIG. 3 in which like reference numerals refer to like features in FIG. 2 and at a subsequent fabrication stage, a top surface 21 of the gap-fill layer 20 may be recessed relative to the top surface 11 of the fin 10 using an etch-back process. The etch-back process may be conducted with a given etch chemistry that removes the dielectric material of the gap-fill layer 20 selective to the semiconductor material of the fin 10. In an embodiment, the etching process may be a chemical oxide removal (COR) process that provides a controlled removal rate. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. After etch back, the gap-fill layer 20 has a recessed thickness, h1, that is less than the as-planarized thickness. The difference in the thickness, h0, and the thickness, h1, reflects a distance in the vertical direction by which the gap-fill layer 20 is recessed by the etch-back process.

A top spacer layer 22 is formed on the top surface 21 of the gap-fill layer 20. The top spacer layer 22 may be composed of a dielectric material, such as silicon nitride ($Si_3N_4$), that is deposited by CVD and then planarized by CMP. The fin 10 penetrates in the vertical direction through the thickness of the top spacer layer 22 so that the top surface 11 of the fin 10 is exposed and accessible for subsequent processing. The recessed top surface 21 of the gap-fill layer 20 provides a vertical space adequate to form the top spacer layer 22 without covering the top surface 11 of the fin 10.

A top source/drain region 24 is formed on the top surface 11 of the fin 10 that is exposed through the top spacer layer 22. The semiconductor material constituting the top source/drain region 24 is doped to have the same conductivity type as the bottom source/drain region 12. For example, if the bottom source/drain region 12 is n-type, then the top source/drain region 24 may be an epitaxial layer of semiconductor material formed by an epitaxial growth process with in-situ doping, and may include a concentration of an n-type dopant from Group V of the Periodic Table (e.g., phosphorus (P) or arsenic (As)) that is effective to impart n-type electrical conductivity to the constituent semiconductor material. In an embodiment, the top source/drain region 24 may be formed by a selective epitaxial growth (SEG) process in which semiconductor material nucleates for epitaxial growth on semiconductor surfaces (e.g., fin 10), but does not nucleate for epitaxial growth from insulator surfaces (e.g., top spacer layer 22). The top source/drain region 24 may grow upwardly and laterally to overgrow an area of the top surface of the top spacer layer 22 near the fin 10. In particular, the top source/drain region 24 may have a width or dimension, d1, that is greater than the width or dimension, d2, of the fin 10 such that the top source/drain region 24 has a larger area in vertical cross-section than the fin 10. The difference in these dimensions may provide a measure of the lateral overgrowth.

Figure 4:
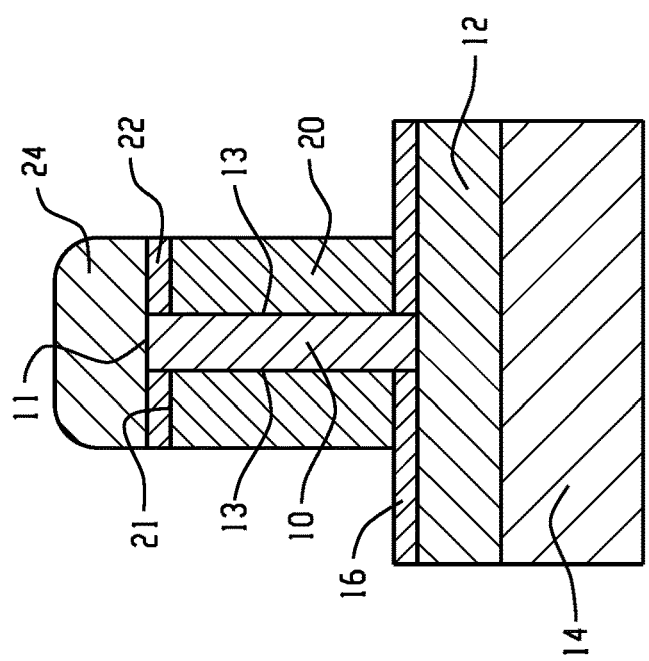

With reference to FIG. 4 in which like reference numerals refer to like features in FIG. 3 and at a subsequent fabrication stage, the top spacer layer 22 and the gap-fill layer 20 are patterned using an etching process with the top source/drain region 24 functioning as an etch mask. The etching process may be reactive ion etching (RIE) using etch chemistries selected such that the gap-fill layer 20 operates as an etch stop when the top spacer layer 22 is patterned, and the bottom spacer layer 16 operates as an etch stop when the gap-fill layer 20 is patterned. The etching process is also selective to the material of the top source/drain region 24, which permits the top source/drain region 24 to function as the etch mask. The area of the etch mask is equal to the area covered by the top source/drain region 24 on the top surface of the top spacer layer 22.

With reference to FIG. 5 in which like reference numerals refer to like features in FIG. 4 and at a subsequent fabrication stage, the gap-fill layer 20 is removed with an etching process to open a space 30 that is located in the vertical direction between the top spacer layer 22 and the bottom spacer layer 16 along the height of the fin 10. The etching process may be a wet chemical etch process using an etch chemistry that removes the material of the gap-fill layer 20 selective to the materials of the fin 10 and the bottom spacer layer 16. In an embodiment in which the gap-fill layer 20 is silicon dioxide and the bottom spacer layer 16 is silicon nitride, the etching process may be a wet chemical etch using a hydrofluoric acid solution. The space 30 reveals portions of the vertical sidewalls 13 of the fin 10, and extends in the vertical direction from the bottom spacer layer 16 to the top spacer layer 22.

The depth of the space 30 is established by the dimensional difference between the fin 10 and the top source/drain region 24. Specifically, the depth of the space 30 is given by the difference in the width of the top source/drain region 24 and the sidewalls 13 of the fin 10. The space 30 has a height, h1, in a vertical direction that is orthogonal to the depth of the space 30 and that is equal to the recessed thickness of the gap-fill layer 20. The fin 10 has a height, h2, in the vertical direction, and the height of the space 30 is equal to a fraction of the height of the fin 10. The space 30 is spaced in a vertical direction between the bottom source/drain region 12 and the top source/drain region 24 along the height of the fin 10 and, in an embodiment, the space 30 may be symmetrically positioned in the vertical direction between the bottom source/drain region 12 and the top source/drain region 24.

An anneal may be performed to diffuse dopant from the bottom source/drain region 12 into a lower portion of the fin 10 near the bottom spacer layer 16, and to diffuse dopant from the top source/drain region 24 into an upper portion of the fin 10 near the top spacer layer 22. The upper and lower doped portions of the fin 10 may function as respective extensions 23, 25 of the bottom and top source/drain regions 12, 24 that are characterized by enhanced electrical conductivity due to the transferred dopant.

Figure 6:
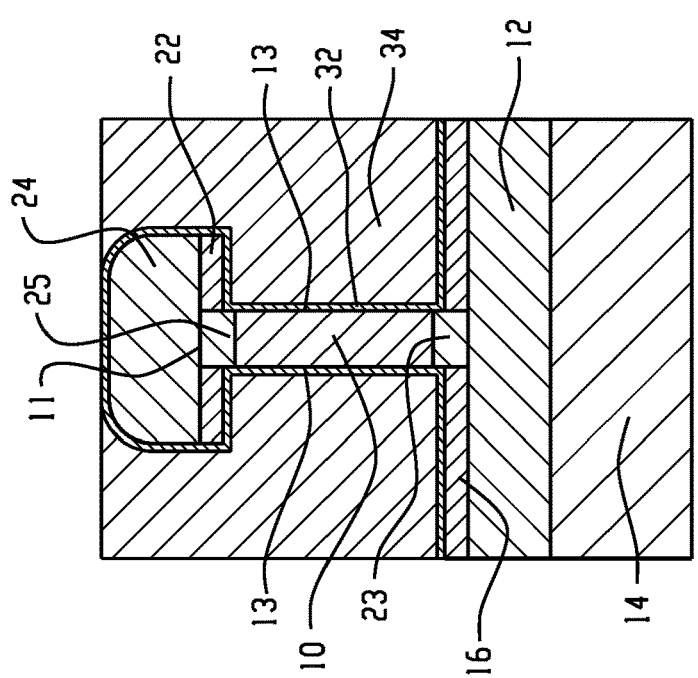

With reference to FIG. 6 in which like reference numerals refer to like features in FIG. 5 and at a subsequent fabrication stage, a gate dielectric layer 32 is formed with a given thickness on the exposed surfaces of the top source/drain region 24, the top spacer layer 22, the fin 10, and the bottom spacer layer 16. In particular, the gate dielectric layer 32 coats the vertical sidewalls 13 of the fin 10 exposed inside the space 30 (FIG. 5). The gate dielectric layer 32 may be composed of an electrical insulator having with a dielectric constant (e.g., a permittivity) characteristic of a dielectric material deposited conformally by CVD, ALD, etc. In an embodiment, the gate dielectric layer 32 may be comprised of a high-k dielectric material characterized by a dielectric constant greater than or equal to 10. The gate dielectric layer 32 may be conformal when deposited so as to have a thickness that is approximately constant independent of the geometry of coated features. In contrast to the gate dielectric layer 32, the dielectric material forming the bottom spacer layer 16 and the top spacer layer 22 may have a dielectric constant that is less than or equal to 8. For example, spacer layers 16, 22 composed of silicon nitride ($Si_3N_4$) have a dielectric constant of 7.5.

A gate electrode layer 34 is formed as a blanket layer. Material from the gate electrode layer 34 fills the open volume inside the space 30. The gate electrode layer 34 may be composed of one or more metals (e.g., titanium (Ti), titanium aluminum carbide (TiAlC), titanium nitride (TiN), and/or tungsten (W)) deposited by physical vapor deposition (PVD), CVD, ALD etc.

Figure 7:
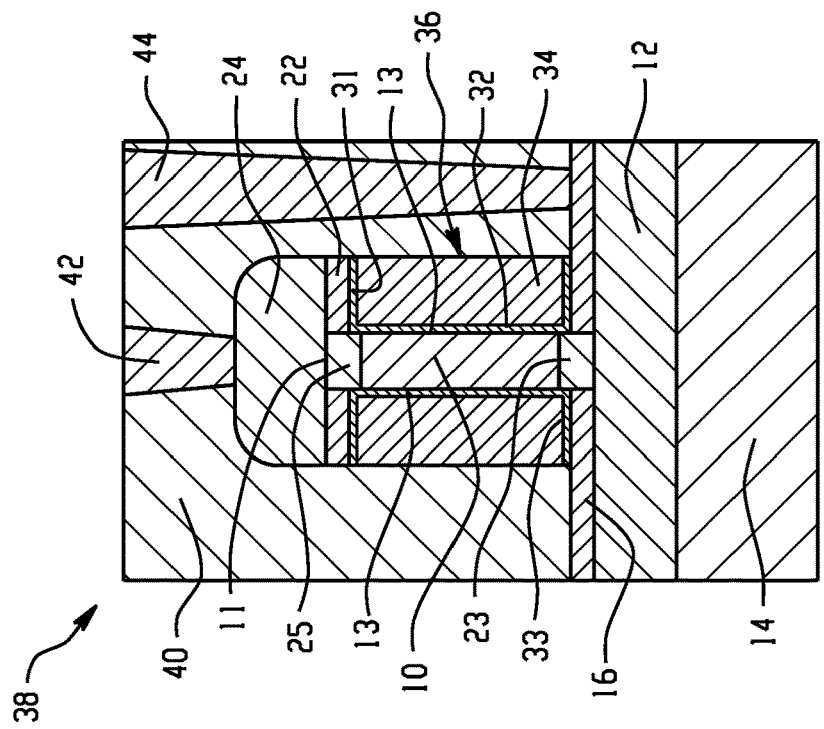

With reference to FIG. 7 in which like reference numerals refer to like features in FIG. 6 and at a subsequent fabrication stage, a gate electrode 36 may be formed from the gate electrode layer 34 by an etching process, such as reactive ion etching (ME). The material of the gate dielectric layer 32 may function as a hardmask during the etching process. After the gate electrode 36 is formed, the gate dielectric layer 32 may be selectively removed by an etching process from the exposed surfaces of the top source/drain region 24 and the bottom spacer layer 16. The gate electrode 36 is formed without performing an etch-back process to reduce its thickness and is shaped by patterning after the top spacer layer 22 is formed and also after the top source/drain region 24 is formed.

The gate electrode 36 surrounds a vertical channel region in the fin 10, and is separated from the vertical sidewalls 13 of the fin 10 by the gate dielectric layer 32. The gate electrode 36 has inner and outer vertical edges that are aligned parallel to the vertical sidewalls 13 of the fin 10. The width of the gate electrode 36 in a horizontal direction orthogonal to vertical direction along the parallel heights of the fin 10 and the space 30 (i.e., parallel to the inner and outer vertical edges) is equal to a difference between the width of the top source/drain region 24 and a sum of the width of the fin 10 and the thickness of the gate dielectric layer 32.

The gate dielectric layer 32 includes an upper section 31 that is located vertically between the gate electrode 36 and the top spacer layer 22, a lower section 33 that is located in the vertical direction between the gate electrode 36 and the bottom spacer layer 16, and a vertical section that is located on the vertical sidewalls 13 of the fin 10 and in the vertical direction between the upper section 31 and the lower section 33. The upper and lower sections 31, 33 extend laterally outward from the section on each of the vertical sidewalls 13 of the fin 10 to a vertical outer edge of the gate electrode 36. The upper section 31 of the gate dielectric layer 32 is not removed by etching because of the manner in which the gate electrode 36 is formed inside the space 30. Specifically, the gate dielectric layer 32 and gate electrode layer 34 are not recessed by etching, but are instead formed inside the space 30 of predetermined vertical and lateral dimensions.

The resulting device structure is a vertical field-effect transistor 38 that includes the fin 10, the bottom source/drain region 12, the top source/drain region 24, and the gate electrode 36 that is arranged along the height of the fin 10 in the vertical direction between the bottom source/drain region 12 and the top source/drain region 24. During operation, a vertical channel region is defined in a portion of the fin 10 overlapped by the gate electrode 36 in the vertical direction between the bottom source/drain region 12 and the top source/drain region 24. The extension 23 of the top source/drain region 24 bridges the portion of the fin 10 that is overlapped by the top spacer layer 22, and the extension 25 of the bottom source/drain region 12 bridges the portion of the fin 10 that is overlapped by the bottom spacer layer 16.

Middle-of-line (MOL) processing follows to define a local interconnect structure. to that end, an interlayer dielectric layer 40 composed of, for example, silicon dioxide may be deposited by CVD and planarized by, for example, CMP. A contact 42 is formed in the interlayer dielectric layer 40 and extends in the vertical direction through the interlayer dielectric layer 40 to contact the top source/drain region 24. A contact 44 is formed in the interlayer dielectric layer 40 and extends in the vertical direction through the interlayer dielectric layer 40 to contact the bottom source/drain region 12. Another contact (not shown) is formed in the interlayer dielectric layer 40 and extends in the vertical direction through the interlayer dielectric layer 40 to contact the gate electrode 36. The contacts 42, 44 may be composed of a conductor, such as tungsten (W), and may be clad with a conductive liner (e.g., titanium nitride (TiN)).

Back-end-of-line (BEOL) processing follows, which includes formation of dielectric layers, via plugs, and wiring for an interconnect structure coupled by the local interconnect structure with the vertical field-effect transistor 38, as well as other similar contacts for additional device structures that replicate the vertical field-effect transistor 38.

The space 30, in which the gate electrode 36 is situated in the vertical field-effect transistor 38, is formed in a self-aligned manner relative to the top source/drain region 24. The gate length of the vertical field-effect transistor 38 is controlled by the height of the fin 10 and the vertical dimension of the space 30, and is equal to the height of the space 30 in which the gate electrode 36 is positioned. Accordingly, the gate length of the vertical field-effect transistor 38 is equal to the recessed thickness of the gap-fill layer 20, which is removed to open the space in which the gate electrode 36 and gate dielectric layer 32 are formed. The extensions 23, 25 of the bottom and top source/drain regions 12, 24 and the well-controlled thicknesses of the bottom and top spacer layers 16, 22 establish precise locations for the junctions of the vertical field-effect transistor 38 that border the channel along the height of the fin 10.

The lower section 33 of the gate dielectric layer 32 is located in the vertical direction between the gate electrode 36 and the bottom spacer layer 16. The upper section 31 of the gate dielectric layer 32 is located in the vertical direction between the gate electrode 36 and the top spacer layer 22, and is retained in the vertical field-effect transistor 38 because of the manner in which the gate dielectric layer 32 is formed on the surfaces of the space 30 and the gate electrode 36 is formed inside the space 30. In a conventional device structure, the top section of the gate dielectric layer is removed when the gate electrode layer is recessed to form a gate electrode.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The terms "horizontal" and "lateral" as used herein are defined as a plane parallel to a conventional plane of a semiconductor substrate, regardless of its actual three-dimensional spatial orientation. The terms "vertical" and "normal" refer to a direction perpendicular to the horizontal, as just defined. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a vertical field-effect transistor, the structure comprising:
   a first source/drain region;
   a second source/drain region;
   a semiconductor fin having a sidewall that extends in a vertical direction from the first source/drain region to the second source/drain region;
   a gate electrode coupled with the sidewall of the semiconductor fin, the gate electrode arranged in the vertical direction between the first source/drain region and the second source/drain region; and
   a gate dielectric layer having a first section aligned in the vertical direction and a second section aligned in a horizontal direction orthogonal to the vertical direction, the first section positioned in the horizontal direction between the gate electrode and the sidewall of the semiconductor fin, and the second section positioned in the vertical direction between the gate electrode and the second source/drain region,
   wherein the gate electrode and the second source/drain region have equal widths in the horizontal direction.

2. The structure of claim 1 comprising:
   a first spacer layer positioned in the vertical direction between the second source/drain region and the gate electrode,
   wherein the first spacer layer is positioned in the vertical direction between the second section of the gate dielectric layer and the gate electrode, and the semiconductor fin projects through the first spacer layer to the second source/drain region.

3. The structure of claim 2 wherein the gate dielectric layer is composed of a high-k dielectric material having a dielectric constant greater than or equal to 10, and the first spacer layer is composed of a dielectric material having a dielectric constant less than or equal to 8.

4. The structure of claim 2 further comprising:
   a second spacer layer positioned in the vertical direction between the first source/drain region and the gate electrode,
   wherein the gate dielectric layer includes a third section that is positioned in the vertical direction between the second spacer layer and the gate electrode, and the semiconductor fin projects through the first spacer layer to the first source/drain region.

5. The structure of claim 4 wherein the third section of the gate dielectric layer is aligned in the horizontal direction, the third section of the gate dielectric layer is aligned parallel to the second section of the gate dielectric layer, and the first section of the gate dielectric layer extends in the vertical direction from the second section of the gate dielectric layer to the third section of the gate dielectric layer.

6. A structure for a vertical field-effect transistor, the structure comprising:
   a first source/drain region;
   a second source/drain region;
   a semiconductor fin having a sidewall that extends in a vertical direction from the first source/drain region to the second source/drain region, the semiconductor fin including a channel region;
   an extension comprised of a doped portion of the semiconductor fin, the extension located in the vertical direction between the channel region and the second source/drain region; and
   a gate electrode coupled with the sidewall of the semiconductor fin, the gate electrode arranged in the vertical direction between the first source/drain region and the second source/drain region,
   wherein the gate electrode and the second source/drain region have equal widths in a horizontal direction orthogonal to the vertical direction.

7. The structure of claim 6 comprising:
   a gate dielectric layer having a first section and a second section, the first section positioned in the horizontal direction between the gate electrode and the sidewall of the semiconductor fin, and the second section positioned in the vertical direction between the gate electrode and the second source/drain region.

8. The structure of claim 7 wherein the first section of the gate dielectric layer is aligned in the vertical direction, and the second section of the gate dielectric layer is aligned in the horizontal direction.

9. A method of forming a vertical field-effect transistor, the method comprising:
   forming a first source/drain region;
   forming a semiconductor fin projecting in a vertical direction from the first source/drain region;
   forming a first spacer layer on the first source/drain region;
   forming a dielectric layer surrounding a sidewall of the semiconductor fin and extending with a first thickness in the vertical direction from the first spacer layer to a top surface of the semiconductor fin;
   recessing the dielectric layer in the vertical direction to provide a second thickness that is less than the first thickness;
   after the dielectric layer is recessed, forming a second spacer layer on the dielectric layer such that the dielectric layer is located in the vertical direction between the first spacer layer and the second spacer layer;

removing the dielectric layer to form a space between the first spacer layer and the second spacer layer; and after the dielectric layer is removed from the space, forming a gate electrode in the space, wherein the vertical field-effect transistor has a gate length that is equal to the second thickness of the dielectric layer.

10. The method of claim 9 wherein the first spacer layer is formed by gas cluster ion beam deposition.

11. The method of claim 9 further comprising:

forming a second source/drain region coupled with the top surface of the semiconductor fin and spaced from the first source/drain region in the vertical direction along a height of the semiconductor fin.

12. The method of claim 11 wherein the first source/drain region and the second source/drain region each contain a concentration of a dopant, and further comprising:

forming a first extension in the semiconductor fin by annealing to transfer a portion of the dopant from the first source/drain region into a first portion of the semiconductor fin adjacent to the first source/drain region; and forming a second extension in the semiconductor fin by annealing to transfer a portion of the dopant from the second source/drain region into a second portion of the semiconductor fin adjacent to the second source/drain region.

13. The method of claim 11 further comprising:

etching the second spacer layer and the dielectric layer with the second source/drain region acting as an etch mask.

14. The method of claim 13 wherein the dielectric layer is removed from the space after the second spacer layer and the dielectric layer are etched.

15. The method of claim 11 wherein the second source/drain region is formed with a selective epitaxial growth process.

16. The method of claim 15 wherein the second source/drain region grows in the vertical direction relative to the top surface of the semiconductor fin and laterally outward over the second spacer layer in a horizontal direction orthogonal to the vertical direction, and the second source/drain region covers an area on the top surface of the second spacer layer determined by a distance of lateral growth.

17. The method of claim 9 further comprising:

before the gate electrode is formed in the space, depositing a gate dielectric layer that conformally coats the first spacer layer adjacent to the space, the sidewall of the semiconductor fin, and the second spacer layer adjacent to the space.

18. The method of claim 17 wherein the gate dielectric layer includes a first section that is located in the vertical direction between the gate electrode and the sidewall of the semiconductor fin, and the gate dielectric layer includes a second section that is located in the vertical direction between the second spacer layer and the gate electrode.

19. The method of claim 18 wherein the first section of the gate dielectric layer is aligned in the vertical direction, and the second section of the gate dielectric layer is aligned in a horizontal direction orthogonal to the vertical direction.

20. The method of claim 19 wherein the gate dielectric layer includes a third section that is located in the space between the first spacer layer and the dielectric layer, the third section of the gate dielectric layer is aligned in the horizontal direction, and the third section of the gate dielectric layer is aligned parallel to the second section of the gate dielectric layer.

* * * * *